(12) United States Patent
Herpst et al.

(10) Patent No.: US 9,329,282 B2
(45) Date of Patent: May 3, 2016

(54) RADIATION DETECTOR

(75) Inventors: Robert D. Herpst, Mahwah, NJ (US);
Vladimir Yakimovich, Ridgefield Park, NJ (US)

(73) Assignee: International Crystal Laboratories, Garfield, NJ (US)

( * ) Notice: Subject to any disclaimer, the term of this patent is extended or adjusted under 35 U.S.C. 154(b) by 0 days.

(21) Appl. No.: 14/009,141

(22) PCT Filed: Apr. 5, 2012

(86) PCT No.: PCT/US2012/032275
§ 371 (c)(1),
(2), (4) Date: Oct. 1, 2013

(87) PCT Pub. No.: WO2012/154334
PCT Pub. Date: Nov. 15, 2012

(65) Prior Publication Data
US 2014/0246598 A1    Sep. 4, 2014

Related U.S. Application Data

(60) Provisional application No. 61/516,642, filed on Apr. 6, 2011, provisional application No. 61/517,345, filed on Apr. 18, 2011, provisional application No. 61/518,813, filed on May 12, 2011, provisional application No. 61/518,941, filed on May 13, 2011.

(51) Int. Cl.
*H01L 27/146* (2006.01)
*G01T 1/24* (2006.01)
(Continued)

(52) U.S. Cl.
CPC ............ *G01T 1/24* (2013.01); *H01L 31/02966* (2013.01); *H01L 31/085* (2013.01)

(58) Field of Classification Search
CPC ......................................................... G01T 1/24
USPC ........................................ 250/370.01–370.15
See application file for complete search history.

(56) References Cited

U.S. PATENT DOCUMENTS 4,052,211 A * 10/1977 Inoue et al. .................... 430/325
6,011,264 A * 1/2000 Lachish et al. ........... 250/370.13
(Continued)

FOREIGN PATENT DOCUMENTS

JP         62275100 A  * 11/1987   ............. C30B 29/48

OTHER PUBLICATIONS

Ihn et al., "Optical properties of Cd1—xMgxTe (x-0.00, 0.23, 0.31, and 0.43) alloy films," 2004, Applied Physics Letters, vol. 84, No. 5, pp. 693-695.*

(Continued)

*Primary Examiner* — Kiho Kim
(74) *Attorney, Agent, or Firm* — Klauber & Jackson LLC

(57) ABSTRACT

The present invention provides a radiation detection system for detecting X-ray and gamma rays featuring $Cd_{1-x}Mg_xTe$ in solid solution as a crystal semiconductor and electrical connection means. The crystal has a composition in the range of $Cd_{0.99}Mg_{0.01}Te$ to $Cd_{0.71}Mg_{0.29}Te$ and may be doped with indium or another Group III element, which may be suitable for use at room temperature as well as controlled temperatures. The present invention further provides a method for detecting X- or gamma ray radiation by (a) providing a solid solution $Cd_{1-x}Mg_xTe$ crystal in the composition range of $Cd_{0.99}Mg_{0.01}Te$ to $Cd_{0.71}Mg_{0.29}Te$; (b) providing an electrical contact means for connecting the $Cd_{1-x}Mg_xTe$ crystal to an amplification, measurement, identification or imaging means; and (c) detecting the presence of the X- or gamma ray radiation.

16 Claims, 12 Drawing Sheets

Planar Detector and Detector System

(51) Int. Cl.
*H01L 31/0296* (2006.01)
*H01L 31/08* (2006.01)

(56) References Cited

U.S. PATENT DOCUMENTS

| | | | |
|---|---|---|---|
| 7,064,082 B2 * | 6/2006 | Polichar et al. | 438/745 |
| 7,518,207 B1 * | 4/2009 | Chen et al. | 257/442 |
| 2003/0223534 A1 * | 12/2003 | Sato et al. | 378/19 |
| 2006/0081785 A1 * | 4/2006 | Heismann et al. | 250/370.09 |
| 2007/0051937 A1 * | 3/2007 | Kishino et al. | 257/13 |
| 2008/0157255 A1 * | 7/2008 | Kominami et al. | 257/459 |
| 2010/0133584 A1 * | 6/2010 | Basu et al. | 257/184 |
| 2010/0294346 A1 * | 11/2010 | Frolov et al. | 136/252 |

OTHER PUBLICATIONS

Boeck et al., "Indium doping of $Hg_{1-x}Cd_xTe$ grown by liquid phase epitaxy," 1993, Journal of Crystal Growth, vol. 129, Issues 1-2, Abstract only.*

Shitaya et al., "Emission spectra of $Cd_{1-x}Mg_xTe$ light emitting diodes", 1972, Applied Physics Letters, vol. 21, No. 11, pp. 523-524.*

* cited by examiner

Wafer from 1st ingot

Twins, stress and voids are visible all over ingot

Wafer from 2nd ingot

A lot of voids generated from the first to freeze to middle region

Wafer from 4th ingot

A few voids and twins at edge generated

Wafer from latest ingot

Voids eliminated in the latest growth and almost entire single crystal obtained

Planar Detector and Detector System

X-ray energy: 25keV
Scan resolution: 100μm

Planar $Cd_{x-1}Mg_xTe$ Detector and Voltage Source

Planar Detector

Co-Planar Grid Detector

Pixelated (Pad) Detector

True Coaxial

Closed-ended Coaxial

Closed-ended Coaxial (bulletized)

—— Represents electrical contact surface

RADIATION DETECTOR

CROSS REFERENCE TO RELATED APPLICATIONS

This application is the National Stage of International Application No. PCT/US2012/032275, filed Apr. 5, 2012, which claims the benefit of priority to U.S. Provisional Application Nos. 61/516,642 filed Apr. 6, 2011, 61/517,345 filed Apr. 18, 2011, 61/518,813 filed May 12, 2011, and 61/518,941 filed May 13, 2011, the disclosures of which are herein incorporated by reference in their entireties. Applicants claim the benefit of 35 U.S.C. §120 as to the PCT application and the United States provisional applications.

FIELD OF THE INVENTION

The present invention is in the field of semiconductor detectors, especially semiconductor detectors suitable for detecting X-ray and gamma ray radiation at room temperature.

BACKGROUND OF THE INVENTION

The promise of semiconductor based radiation detectors has not been fully met despite high demand for such detectors in many areas, including homeland security, medical imaging, spectroscopy and astrophysics, because the most promising semiconductor materials for this application do not produce high crystal growth yields while those materials that produce high yields do not possess ideal material properties. (Balboa, O. S., Surface and Bulk Defects in Cadmium Zinc Telluride and Cadmium Manganese Telluride Crystals, Doctoral Disertation, Vanderbilt University (2009))

Semiconductor radiation detectors are the most recent type of detectors developed, and they are very useful because they convert X-ray and gamma quantum (photons) directly into electrical pulses and they have small dimensions. The main requirements for a semiconductor crystal based detector are: (1) a large atomic number to absorb the radiation, (2) a wide energy bandgap ($E_g$,eV) of the semiconductor to work at room temperature, (3) high resistivity, (4) good electron transport properties, (5) homogeneity, and (6) crystalline perfection. (Toney et al., *Nucl. Instrum. Methods* 1999; A428:14) The last four properties are highly dependent upon the crystal employed as the semiconductor and the technology of growing of such crystals. For example, the lifetime of electrons and holes before their recombination (the most important value of the detector specification) usually changes in the region $10^{-12}$ sec to $10^{-2}$ sec and may be improved upon by as much as thousands of times by virtue of increasing the purity of the crystal material and lowering the concentration of crystal defects. Crystal quality can be improved by those skilled in the art by improving growth conditions and material purity. Improvement of crystal purity and quality creates a better signal by limiting premature electron hole recombination and trapping. Premature recombination of electrons and holes occurs at the location of defects and impurities in the crystal lattice. Premature recombination means recombination before the electrons and holes reach the positively and negatively charged electrodes that are attached to the crystal to form the detector. Trapping is the immobilization of a hole or electron near the middle of the band gap caused by crystal impurities occupying substitution lattice positions. (Balboa, O. S., Surface and Bulk Defects in Cadmium Zinc Telluride and Cadmium Manganese Telluride Crystals, Doctoral Disertation, Vanderbilt University (2009))

In its simple form, a semiconductor has a valence band and a conduction band which are separated by the bandgap of forbidden energies. At 0° K the valence band is completely full of electrons, and the conduction band is completely devoid of electrons. As the temperature rises more electrons inherent in the material migrate from the valence band to the conduction band creating noise current in a semiconductor detector. The larger the bandgap between the conduction band and the valence band, the less noise that occurs at the same temperature. It is known that a bandgap range of 1.7 eV to 2.2 eV is the ideal value for room temperature radiation detector performance. (Toney et al., *Nucl. Instrum. Methods* 1999; A428:14; Glemen F. Knoll, Radiation Detection and Measurement, $3^{rd}$ ed., John Wiley & Sons, pp. 353-357)

Heat is not the only way to energize an electron. The absorption of radiation or collision with an energetic charged particle (proton or quantum) produces the same effect. Once an electron has crossed over to the conduction band, it will move under the influence of an electronic field. The electron leaves a vacancy (known as a "hole") in the valence band. The combination of the two is known as an electron hole pair. The hole, which represents a positive charge, can also be made to move in an electronic field but in the opposite direction of the electron. The motion of both contributes to the observable conductivity of the material. The configuration lasts a short time ($10^{-12}$ seconds), and in the absence of an electronic field, the electrons and holes recombine and the semiconductor crystal returns to its neutral state. Nicholas Tsoulfanidis and Sheldon Landsberger, *Measurement and Detection of Radiation* $3^{RD}$ Ed., 2011, p. 192.

A detector is normally a part of a detection system having a semiconductor crystal with electrodes deposited on its surface and situated within an electrical field. For example, the crystal may have electronically biased (cathode and anode) electrodes. The signal may be conducted to a preamplifier producing a voltage pulse with an amplitude (height) proportional to the energy of the incoming photon, then to a shaping amplifier that amplifies the signal and converts the signal to a Gaussian pulse, followed by a multi channel analyzer that generates a spectrum of the incoming proton. (Glemen F. Knoll, Radiation Detection and Measurement, $3^{rd}$ ed., John Wiley & Sons, pp. 592, 610, 627, 665-680.)

Detectors may be constructed in many different configurations, such as planar (FIG. 10, 11, 3, 14), co-axial (FIG. 15), pixilated (FIG. 14) and Frisch-ring and other insulated and partially insulated detectors. The common feature of all of these detectors is a semiconductor and electrical contact means, although in Frisch ring detectors there is a non-contacting electrode as there exists a thin layer of insulation between all or part of it and the crystal. For example, a planar detector as shown in FIG. 13 is constructed from a $Cd_{1-x}Mg_xTe$ crystal with gold contacts applied to its surface. Typical detector contacts are gold, platinum, copper and aluminum. The contacts may be deposited by various means, but a common technique for applying gold and platinum contacts is electroless metal deposition using solutions of $AuCl_3$ or $PtCl_4$. The solution creates a chemical reaction with the surface of the crystal which deposits the film on the crystal. Detectors may also be used in arrays, such as is an x-ray imaging system. There are also surface preparation requirements to construct the detector, the most prominent of which is etching of the surface of the semiconductor to eliminate surface stress due to the process of grinding and polishing the crystal material and to improve surface perfection. Stress creates defects on the polished surface of crystals which may be the source of recombination of electrons and holes, trapping centers and also a source of reduced resistivity at the perimeter which could create current noise. Etching removes that disturbed layer on the surface of the crystal. Etching may be done with a Bromine-methanol solution. (Balboa, O. S., Surface and Bulk Defects in Cadmium Zinc Telluride and Cadmium Manganese Telluride Crystals, Doctoral Dissertation, Vanderbilt University (2009))

Germanium and Silicon have been widely used as radiation detectors because high purity perfect crystals can be grown in large volume. However, a germanium detector has a small energy bandgap (0.67 eV), and this disadvantage requires that the detector be continuously cooled, making it useless at room temperature and limiting its applicability to portable detector devices. Silicon, with with a low atomic number (14) and an energy bandgap of 1.1 eV, cannot be used for energy higher than a few tens of keV. (Balboa, O. S., Surface and Bulk Defects in Cadmium Zinc Telluride and Cadmium Manganese Telluride Crystals, Doctoral Dissertation, Vanderbilt University (2009)) A bandgap in the range of 1.7 eV to 2.2 eV is considered the ideal value for room temperature radiation detector performance. (Toney et al., *Nucl. Instrum. Methods* 1999; A428:14)

$HgI_2$ has an energy bandgap 2.13 eV and therefore can operate at room temperature, but it suffers from several shortcomings including a surface that becomes degraded after use for a short time making it impractical to employ as a commercial detector. (Glemen F. Knoll, Radiation Detection and Measurement, John Wiley & Sons 2000, p. 484-486) Recently developed CdMnTe has a bandgap of 1.57 eV and has promise for detector applications but it still suffers from very poor crystalline perfection. (Hossain et al., *Journal of Electronic Materials,* 2009; 38(8): p. 1593-1599)

$Cd_{1-x}Zn_xTe$ (also known as "CZT") detectors for X- and gamma rays are produced commercially by several companies including Radiation Montitoring Devices, Inc. and the E.I. Detection Imaging Systems Division of Endicott Interconnect Technologies, Inc. This material is a good radiation absorber because its constituents have large atomic numbers (48, 30, and 52). The energy bandgap of $Cd_{1-x}Zn_xTe$ increases about 6.7 meV per atomic percent of Zn from 1.5 eV of CdTe. However, the widespread deployment of CZT detectors is impeded by high-cost yields due to limited high-quality and large-volume single crystals. (Glemen F. Knoll, Radiation Detection and Measurement, John Wiley &Sons 2000, p. 486-488) These crystals suffer from twins, grain boundaries, Te inclusions, and a high density of dislocations. (Balboa, O. S., Surface and Bulk Defects in Cadmium Zinc Telluride and Cadmium Manganese Telluride Crystals, Doctoral Dissertation, Vanderbilt University (2009)) These disadvantages are pre-determined by the mismatch of the lattice constant of CdTe and ZnTe (0.648 nm and 0.610 nm) and the high segregation coefficient of Zn in CdTe (1.35), both of which tend to create crystal defects such as twins and in-homogeneities. Although large $Cd_{1-x}Zn_x$ Te crystals are grown, only a small portion of the ingot has perfect properties for X- and gamma ray spectroscopy. The typical composition $Cd_{1-x}Zn_xTe$ based detectors is $Cd_{0.9}Zn_{0.1}Te$ with an energy bandgap 1.57 eV. Although a higher concentration of Zn would produce a bigger bandgap closer to the 1.7 eV ideal, crystal growth technical problems have made higher Zn concentration unachievable.

There is a commercial need for a semiconductor detector of X- and gamma rays produced from high yield large size semiconductor solid solution crystals that produce a high energy bandgap suitable for use at room temperature.

SUMMARY OF THE INVENTION

In a first aspect, the present invention provides a radiation detector or radiation detection system having a $Cd_{1-x}Mg_xTe$ crystal in solid solution and one or more electrode. The radiation detector or radiation detection system may further feature an amplification, measurement, identification or imaging means, such as, for instance, a spectrum. The radiation detector or radiation detector system functions at room temperature and may substantially eliminate crystal defects thereby increasing yields and lengthening electron and hole lifetime.

The solid solution $Cd_{1-x}Mg_xTe$ crystal or semiconductor may be in the compositional range of $Cd_{0.99}Mg_{0.01}Te$ to $Cd_{0.71}Mg_{0.29}Te$ or $Cd_{0.95}Mg_{0.05}Te$ to $Cd_{0.60}Mg_{0.40}Te$ or $Cd_{0.90}Mg_{0.10}Te$ to $Cd_{0.65}Mg_{0.35}Te$. Such ratios allow production of large volume crystals which may be processed and configured with electrical contact means and may serve as room temperature detectors for X- and gamma rays. The material may be doped with an element to increase resistivity such as with a Group III element (Al, Ga, or In). Group III dopants may be used to compensate Cd vacancies for the purpose of increasing the resistivity of the solid solution. The dopant may be added to the melt during growth or synthesis or by diffusion into the surface of a crystal after growth. The dopant may be added in amounts of, for instance, $1\times10^{17}$ $cm^{-3}$ to $3\times10^{17}$ $cm^{-3}$ or about $10^{17}$-$10^{18}$ $cm^{-3}$.

The one or more electrodes may include, for instance, gold contacts deposited on the planar crystal faces. In some instances, there may be an insulating layer between the crystal and the one or more electrodes, such as, for instance, as in a Frisch-ring detector.

The radiation detector may further contain or be part of a system such as, for instance, depicted in FIG. 11. There may be a bias voltage source to provide positive and negative voltage. There may be one or more preamplifiers, shaping amplifiers or single or multi-channel analyzers. There may be arrays of detectors such as a medical imaging system. Moreover, the configuration of the detector may be in any form including, for example, coaxial, co-planar, pixelated or pad configurations, a Frisch ring and an array of detectors.

In a second aspect, the present invention provides a method for detecting X-ray or gamma ray radiation by
(a) Providing a solid solution $Cd_{1-x}Mg_xTe$ single crystal in a compositional range of $Cd_{0.99}Mg_{0.01}Te$ to $Cd_{0.71}Mg_{0.29}Te$;
(b) Providing an electrical contact means for connecting the $Cd_{1-x}Mg_xTe$ crystal to an amplification, measurement, identification or imaging means; and
(c) Detecting the presence of the X-ray or gamma ray radiation.

The method may also feature providing a Group III element dopant to the crystal, such as, for instance, Indium. The dopant may be provided in amounts of, for instance, $1\times10^{17}$ $cm^{-3}$ to $3\times10^{17}$ $cm^{-3}$ or about $10^{17}$-$10^{18}$ $cm^{-3}$. In some instances, the amplification, measurement, identification or imaging means is a spectrum. The electrical contact means may include, for instance, gold contacts deposited on planar faces of the crystal. In some instances, there may be an insulating layer between all or part of the crystal and the electrical contact means, such as, for instance, a Frisch-ring detector.

The detecting of the presence of the X-ray or gamma ray radiation may be performed using a system such as, for instance, depicted in FIG. 11. There may be a bias voltage source to provide positive and negative voltage. There may be one or more preamplifiers, shaping amplifiers or single or multi-channel analyzers. There may be one or more arrays of detectors such as a medical imaging system. Moreover, the configuration of the system may be in any form including, for example, coaxial, co-planar, Bolotinikov, cross-strip plate, pixelated or pad configurations, a Frisch ring and one or more arrays of detectors.

DETAILED DESCRIPTION OF THE INVENTION

The present invention provides a radiation detector having $Cd_{1-x}Mg_xTe$ in a solid solution and electrodes. This detector is a significant improvement over the detectors now available such as those based upon Germanium, Silicon, Mercury Iodide, and Cadmium Zinc Telluride, because it functions at room temperature due to its large bandgap and also enables elimination of crystal defects which not only increases yields but also increases electron and hole lifetime.

A low defect solid solution $Cd_{1-x}Mg_xTe$ semiconductor in the compositional range $Cd_{0.99}Mg_{0.01}Te$ to $Cd_{0.71}Mg_{0.29}Te$ enables production of large volume crystals which are processed and configured with electrical contact means as room temperature detectors for X- and gamma rays. The material may be doped with an element to increase resistivity chosen from Group III (Al, Ga, In) which compensate Cd acceptors. Group III dopants are used to compensate Cd vacancies for the purpose of increasing the resistivity of the solid solution because Group III elements have additional donor electrons. Doping may be achieved by adding an element to the melt during growth or synthesis or by diffusion into the surface of a crystal after growth. Resistivity is reduced in the ternary compound $Cd_{1-x}Mg_xTe$ when the compostion moves from stoichiometry to an excess of Te and creates vacancies of Cd. It is of course preferable to use no or minimal doping and to instead develop crystalline perfection and purity, because although doping increases resistivity it also increases the recombination rate.

Cadmium Magnesium Telluride (either "$Cd_{1-x}Mg_xTe$" or "CMgT") and doped $Cd_{1-x}Mg_xTe$ is a material that possesses all required properties for a radiation detector viz. elements with high atomic numbers:

Cd—48
Mg—12
Te—52

Figure 8:
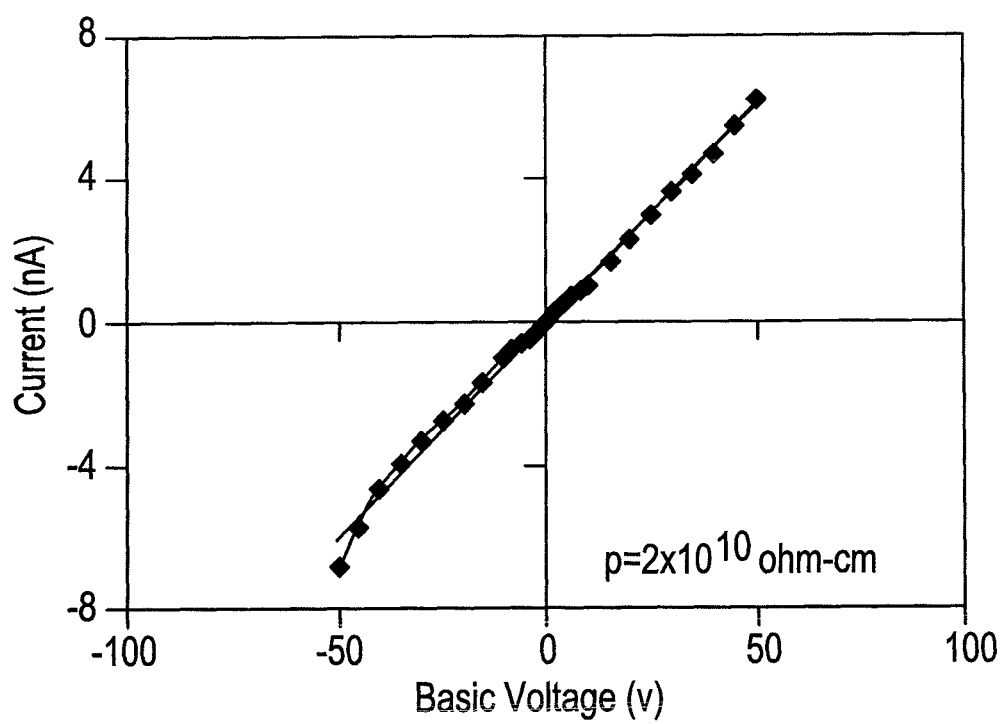
FIG. 8 shows a current versus bias voltage curve from which the resistivity of a planar In doped $Cd_{1-x}Mg_xTe$ detector was calculated at $2 \times 10^{10}$ ohm-cm. Although $2 \times 10^{10}$ ohm-cm is sufficient for a detector, resistivity can be increased as a function of crystal perfection and also improves with optimal dopant concentration.
Figure 9:
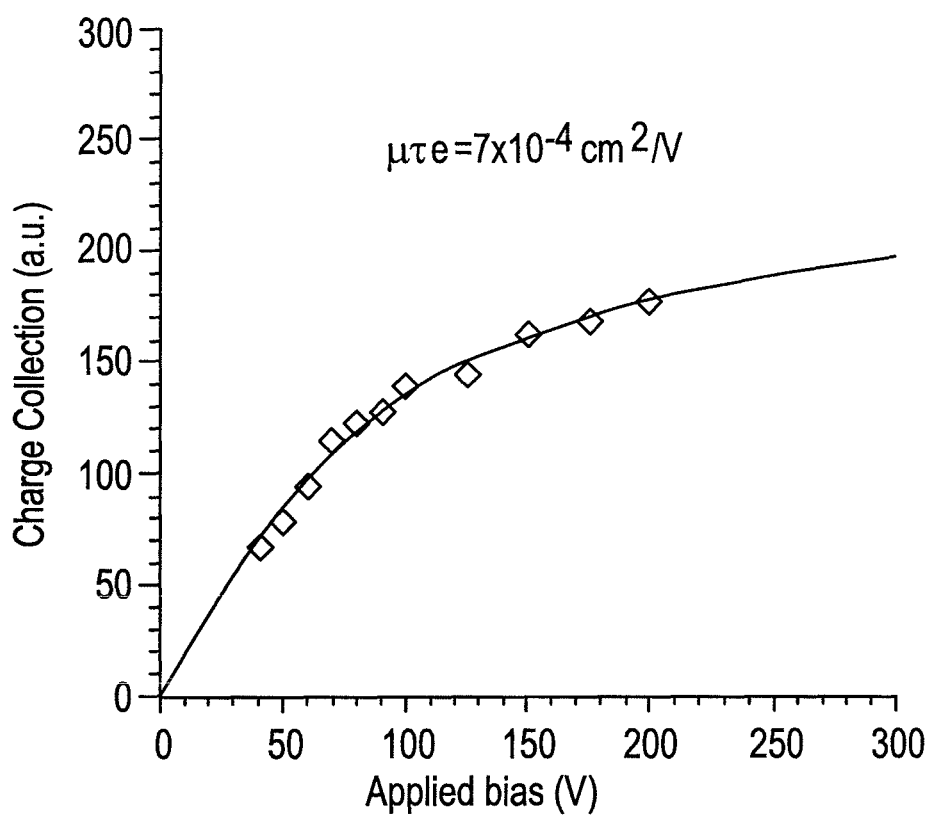
FIG. 9 shows the mobility lifetime of a planar In doped $Cd_{1-x}Mg_xTe$ detector at $7 \times 10^{-4}$ cm$^2$V. This parameter can also be optimized by increasing crystal purity and we have to date achieved $8 \times 10^{-4}$ cm$^2$V as shown in Example 2.
Figure 10A:
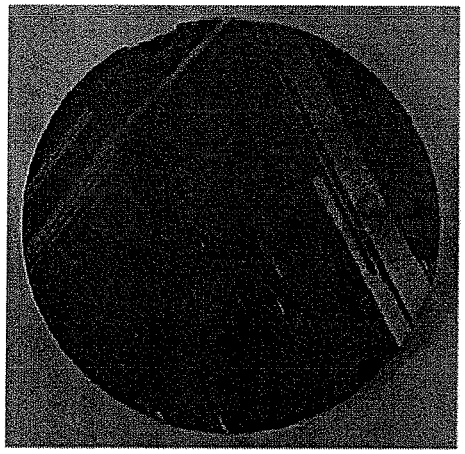
FIG. 10 shows the development of crystal quality over a mere eight (8) growth cycles as growth parameters were adjusted and purity was increased. The second and third ingots show progressive improvement while the last ingot, which was ingot numbr 8, shows that the growth process has evolved to the point where the ingot is almost entirely single crystal.
Figure 10B:
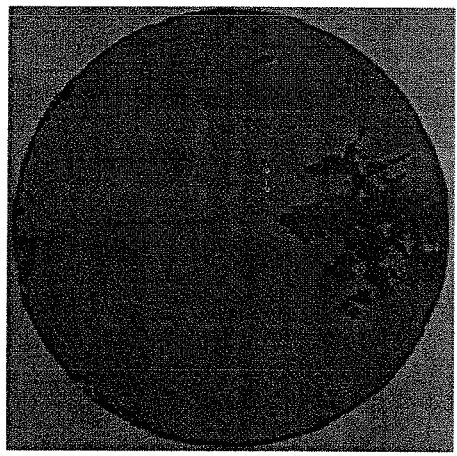
Figure 10C:
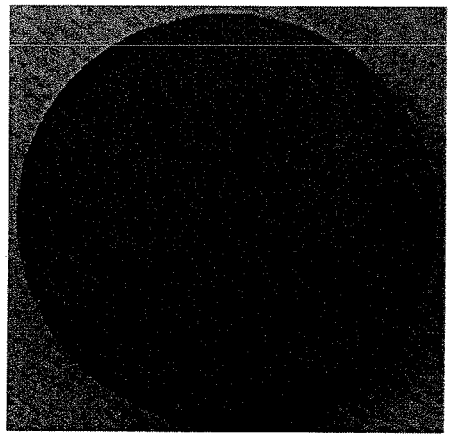
Figure 10D:
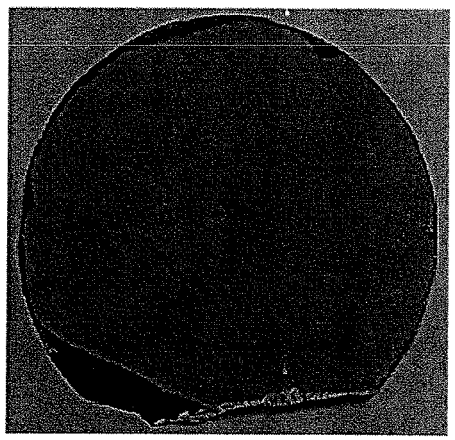

CMgT also has high resistivity ($2 \times 10^{10}$ Ω-cm as measured and theoretically much higher depending on crystal quality) as shown in FIG. 8, and it has high electron transport properties that have already been measured to at ($7 \times 10^{-4}$ cm$^2$V) in preliminary tests as shown in FIG. 9. Moreover, this material offers several distinct advantages over $Cd_{1-x}Zn_xTe$. Among those advantages are:

(1) the optimal energy bandgap of 1.7-2.1 eV is attainable using less Mg in CdTe, to produce a useful solid solution $Cd_{1-x}Mg_xTe$ crystal compared to the amount of Zn needed in CdTe to produce a useful solid solution $Cd_{1-x}Zn_xTe$ crystal, because MgTe has $E_g$=3.5 eV compared to $E_g$=2.2 eV for ZnTe. The energy bandgap of $Cd_{1-x}Mg_xTe$ increases about 17 meV per atomic percent Mg compared with 6.7 meV per atomic percent of Zn in respect of $Cd_{1-x}Zn_xTe$. Therefore 12 at. % Mg in CdTe, produces 1.7 eV compared to the 30 at. % Zn needed in CdTe and 29 at. % Mg in CdTe, produces 2.0 eV. The lower Mg content required to produce the desired bandgap in $Cd_{1-x}Mg_xTe$ compared to the higher requirement in $Cd_{1-x}Zn_xTe$ reduces the composition defects of $Cd_{1-x}Mg_xTe$ crystals.

(2) The segregation coefficient of Mg in CdTe is mostly reported as 1.0 compared to 1.35 for Zn in CdTe, which is an important advantage over CZT for assuring a homogeneous distribution of Mg in CdTe throughout the ingot. (Woodbury et al., *J. Cryst. Growth,* 1971; 10:6; Lorenz et al., *J. Electrochem. Soc.,* 1966; 113:559; Yang et al., Physical Review, 2009; B79: 245202).

(3) The almost identical lattice constants of CdTe (6.48 Å) and MgTe (6.42 Å) yields good crystallinity and the value of the lattice parameters ratio of MgTe is indicative of zinc blende crystal structure.

The characteristics described in (2) and (3) above, viz. segregation coefficient of 1.0, nearly identical lattice constants and tendency to zinc blend crystal structure, include a combination of parameters that yield low defect single crystals that can be grown in large volume, thereby reducing the production costs of devices such as detectors and, in particular, and also enabling production of low cost large-area devices.

The combination of good uniformity, good crystallinity, and tendency to form zinc-blended structures provide low defect large-volume CMgT single crystals, and ultimately reduce the production costs of large-area devices.

Figure 11:
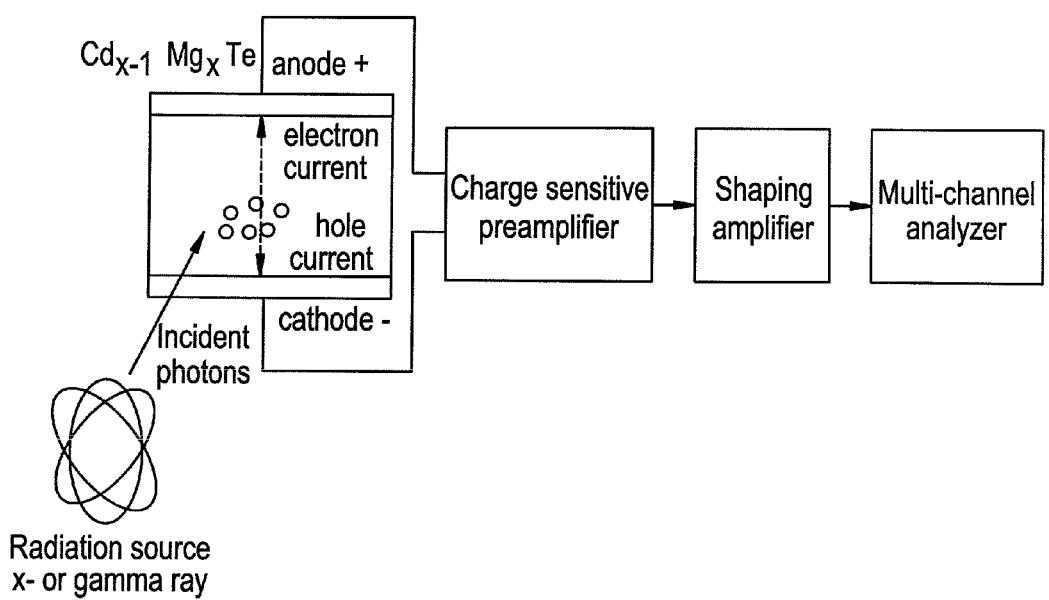
FIG. 11 shows a $Cd_{1-x}Mg_xTe$ planar detector and a detection system comprising a preamplifier, a shaping amplifier and a multi-channel analyzer. When incident protons from a radiation source charge the carrier the electrons and holes move in opposite directions. The signal is then conducted to a preamplifier that produces a voltage pulse with an amplitude (height) proportional to the energy of the incoming photon, then to a shaping amplifier that amplifies the signal and converts the signal to a Gaussian pulse, followed by a multi channel analyzer that generates a spectrum of the incoming proton.
Figure 12:
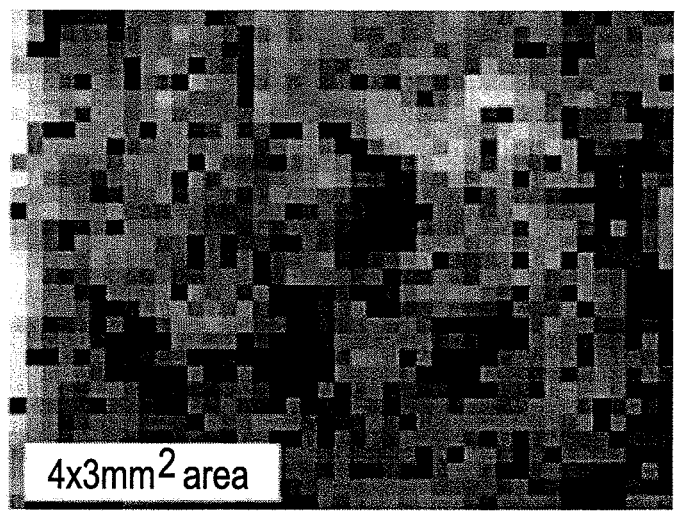
FIG. 12 shows a micro-scale response map of an indium doped $Cd_{0.92}Mg_{0.08}Te$ detector exposed to a low energy x-ray source of 25 keV at a scan resolution of 100 microns, and demonstrates that $Cd_{1-x}Mg_xTe$ can be used as an x-ray detector with good resolution.
Figure 13:
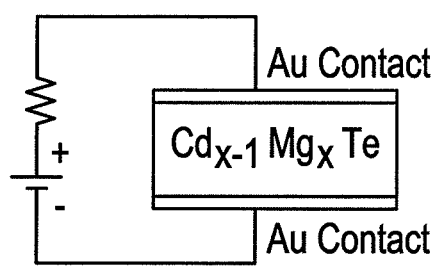
FIG. 13 shows a $Cd_{1-x}Mg_xTe$ planar detector comprising Au electrical contacts, a voltage source and voltage regulation means.
Figure 14A:
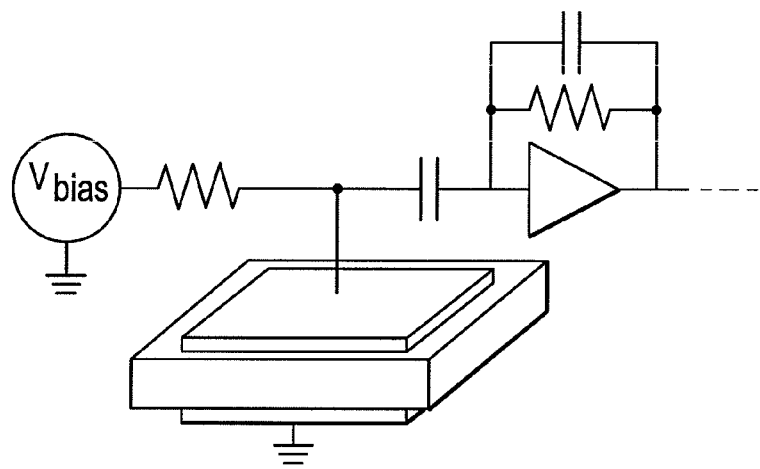
FIG. 14 shows three common configurations of detectors used with CZT as the semiconductor material. From top to bottom are shown a planar detector, a co-planar grid detector and a pixelated or pad detector.
Figure 14B:
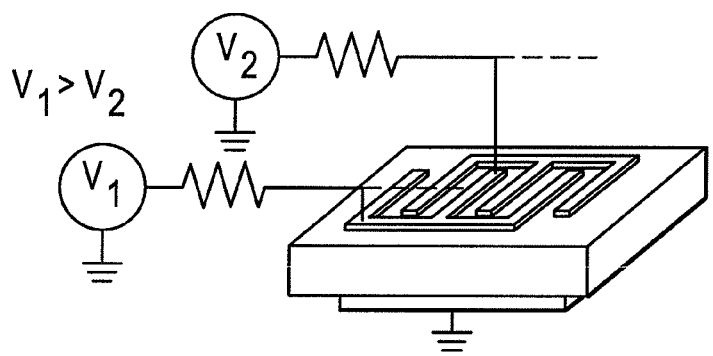
Figure 14C:
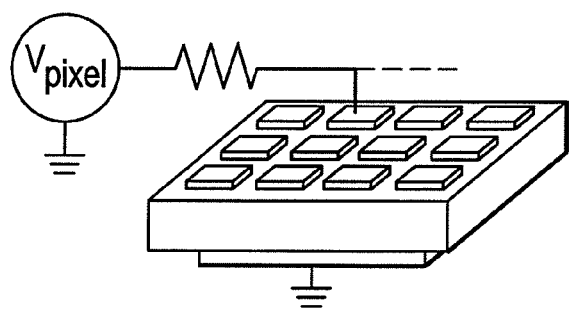
Figure 15A:
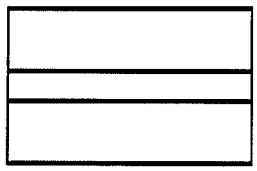
FIG. 15 shows three configurations of coaxial detectors in which the semiconductor crystal is rod shaped and is surrounded by the electrical contact surfaces. Three configurations are shown from left to right, being a true coaxial detector, a closed-ended coaxial detector and closed-ended bulletized coaxial connector. Beneath the three configurations is a cross section of this type of detector appearing as concentric circles in which the semiconductor crystal is the central circle.
Figure 15B:
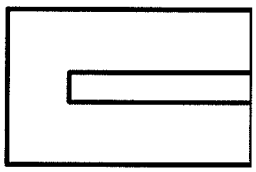
Figure 15C:
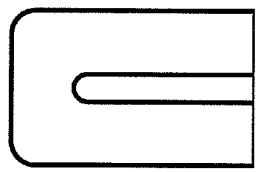
Figure 15D:
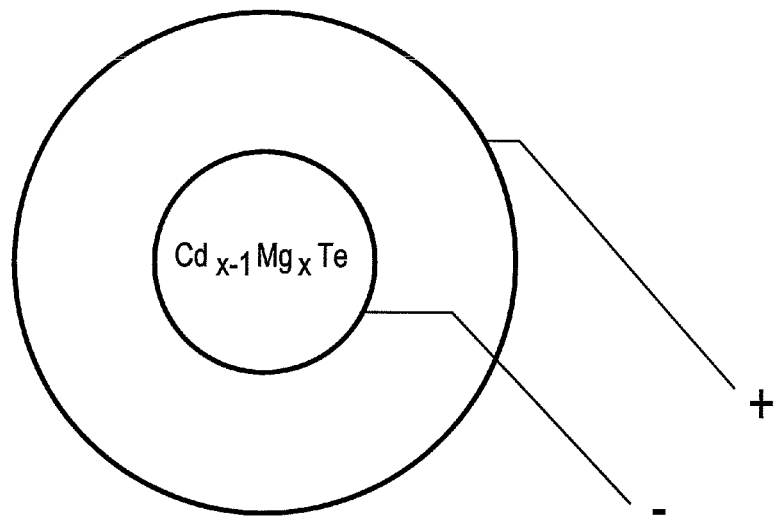

In some instances, the radiation detector includes a planar detector having a $Cd_{1-x}Mg_xTe$ crystal in the composition range $Cd_{0.99}Mg_{0.01}Te$ to $Cd_{0.71}Mg_{0.29}Te$ with gold contacts deposited on the planar crystal faces as shown in FIG. 13. There may be an insulating layer between the crystal and all or part of the electrical contact as in a Frisch-ring detector. There may be an insulating layer on some or all of the longitudinal surface of the crystal such as is described in U.S. Pat. No. 8,063,378, the disclosure of which is herein incorporated by reference, for instance as in FIGS. 3A, 3B, 4 and 7 which insulating layer may also extend to the exterior of an electrode or cathode and further be shielded by a conducting shield such as a contacting ring or Frisch ring around and electrically insulated from the detector crystal body (a "Bolotinikov" detector). The detector may be part of a complex system such as a system of the type shown in FIG. 11 wherein there is a bias voltage source to provide positive and negative voltage as shown in FIG. 14 where there are one or more preamplifiers, shaping amplifiers and single or multi-channel analyzers or in system with arrays of detectors such as a medical imaging system. The configuration of the detector may be in any form including, for example, coaxial, co-planar and pixelated or pad configurations, Frisch ring, Bolotnikov, arrays of detectors and cross-strip plates as shown, for example, in FIGS. 1, 2, 3 and 4 of U.S. Pat. No. 8,063,380, the disclosure of which is herein incorporated by reference ("cross-strip plate" detectors). The $Cd_{1-x}Mg_xTe$ crystal may be doped with Group III elements or undoped and that doping means may include diffusion.

Crystals may be synthesized in a one zone vertical tube furnace with various compositions in the CdTe—MgTe phase diagram. Cd, Mg, Te, and dopants (Al, Ga, In) are mixed with respective compositions in a crucible with a cone bottom, which is inserted into a quartz ampoule and vacuum sealed. Care must be taken during heating to avoid explosions due to a high pressure of elements in the ampoule, which may be achieved by slowly melting the elements.

Single crystals may be grown from synthesized element doped $Cd_{1-x}Mg_xTe$ ingots using the zone melting with solvent method. Tellurium acts as a solvent in accordance with the Gibb's phase rule in Cd—Mg—Te system. Single crystals may be grown by moving the melt zone from the cone bottom to the top of the crucible, but other means such as the traveling heater method may be used by those skilled in the art.

A detector is normally a part of a detection system having a semiconductor crystal with electrodes deposited on its surface (the detector) and situated within an electrical field. For example, the crystal may have electronically biased (cathode and anode) electrodes. The signal may be conducted to a preamplifier producing a voltage pulse with an amplitude (height) proportional to the energy of the incoming photon, then to a shaping amplifier that amplifies the signal and converts the signal to a Gaussian pulse, followed by a multi channel analyzer that generates a spectrum of the incoming proton.

Detectors may be constructed in many different configurations, such as planar (FIG. 10, 11, 3, 14), co-axial (FIG. 15), pixelated (FIG. 14), Frisch-ring, Bolotinikov, and cross-strip plate detectors. The common feature of all of these detectors is a semiconductor and electrical contact means, although in Frisch ring and Bolotinikov detectors there is a non-contacting portion of the electrode as there exists a thin layer of insulation between it and the crystal. For example, a planar detector as shown in FIG. 13 is constructed from a $Cd_{1-x}Mg_xTe$ crystal with gold contacts applied to its surface. Typical detector contacts are gold, platinum, copper and aluminum. The contacts may be deposited by various means, but a common technique for applying gold and platinum contacts is electroless metal deposition using solutions of $AuCl_3$ or $PtCl_4$. The solution creates a chemical reaction with the surface of the crystal which deposits the film on the crystal. Detectors may also be used in arrays, such as is an x-ray imaging system. There are also surface preparation requirements to construct the detector, the most prominent of which is etching of the surface of the semiconductor to eliminate surface stress and improve surface perfection. Stress would the source of recombination of electrons and also a source of reduced resistivity at the perimeter which could create current noise. Etching may be done with a Bromine-methanol solution. Etching also improves the surface quality and it is known that surface defects can act as trapping centers and can result in surface current leakage.

As described herein, it is possible to provide a defects-free large-volume semiconductor detector for X- and gamma rays suitable for operation at room temperature, thereby reducing detector manufacturing and production costs due to increased yields.

EXAMPLE 1

Figure 1:
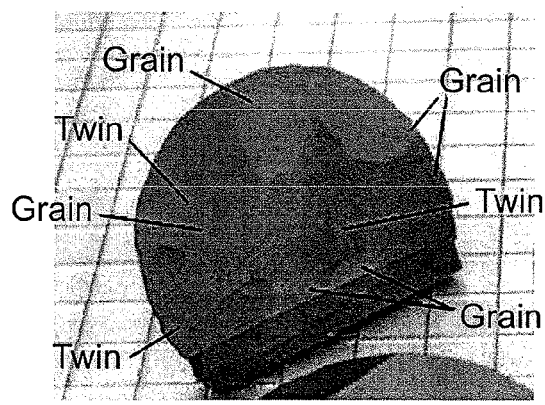
FIG. 1 is a photograph showing the defects in a typical $Cd_{1-x}Zn_xTe$ crystal boule. Grains and twins, which are crystal defects, are labeled. This photograph illustrates a typical $Cd_{1-x}Zn_xTe$ crystal boule. The crystal defects mean that only small sections of the boule (ingot) can be used for detectors and these must be laboriously selected and cut from the boule. This poor crystal structure creates a large amount of waste and increases detector production costs.
Figure 2:
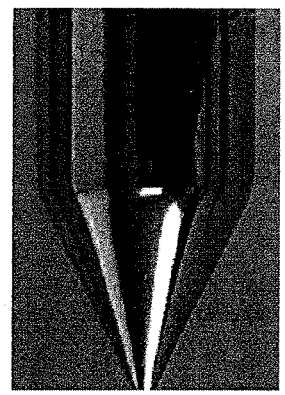
FIG. 2 is a photograph of a low defect 20 mm diameter crystal boule (ingot) of solid solution $Cd_{1-x}Mg_xTe$. The surface of the boule is free of voids and that there is no external indication of defects such as grains or twins.
Figure 3:
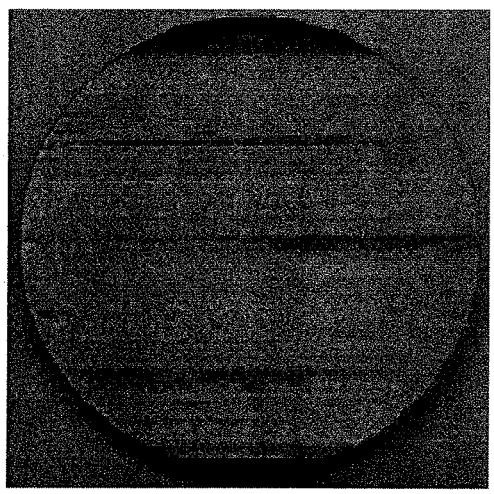
FIG. 3 is a photograph of a cross section slice cut from the $Cd_{1-x}Mg_xTe$ boule shown in FIG. 2. The crystal is free of the grains and twins that typify a $Cd_{1-x}Zn_xTe$ crystal boule as shown in FIG. 1.
Figure 4:
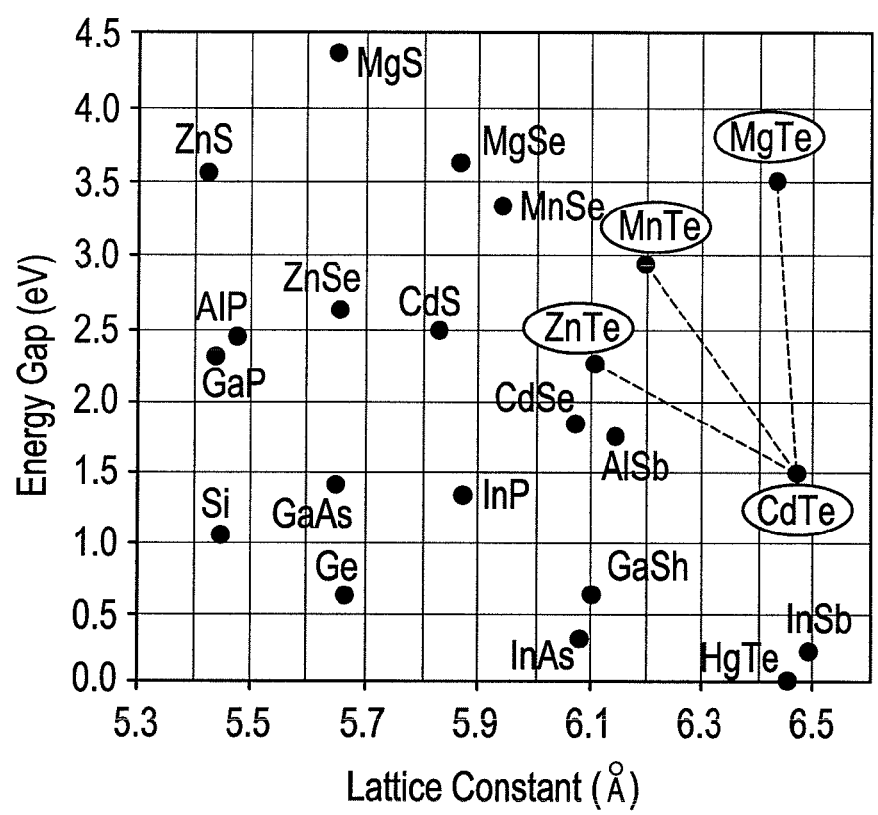
FIG. 4 is a graph showing the lattice constant and the dependence thereon of the energy bandgap of various alloys including CdTe and MgTe. The lattice constants of CdTe and MgTe are very similar whereas the lattice constants of CdTe and MnTe and CdTe and ZnTe are more dissimilar. The almost identical lattice constants of CdTe and MgTe assures that $Cd_{1-x}MgTe$ crystals will be of excellent quality and will have fewer grains and boundaries than $Cd_{x-1}Mn.Te$ and $Cd_{x-1}Zn_xTe$ and will also have a larger band gap.
Figure 5:
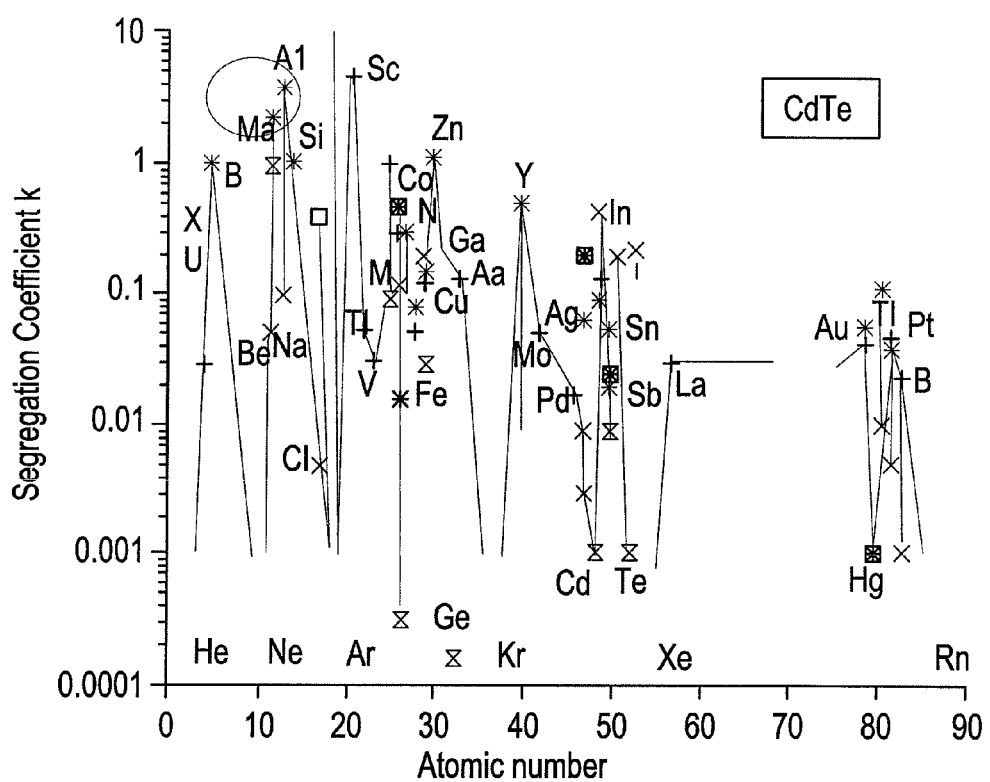
FIG. 5 is a graph showing the segregation coefficient of Mg in CdTe as being close to 1.0 compared to 1.35 for Zn in CdTe, which is an important advantage over CZT for assuring a more homogeneous distribution of Mg in CdTe throughout the ingot as compared to a less homogeneous distribution of Zn throughout a CZT ingot.
Figure 6A:
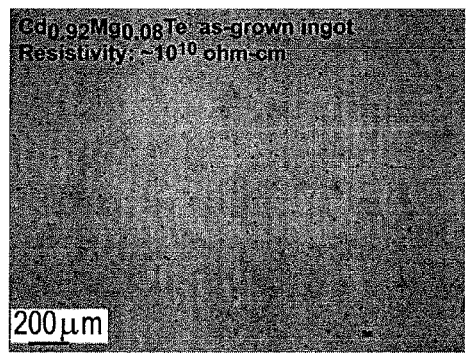
FIG. 6 shows a comparison (Top) of the IR transmission images obtained from a Nikon multi-function microscope of an as grown unannealed $Cd_{1-x}Mg_xTe$ crystal (top Left) with an annealed $Cd_{1-x}Mg_xTe$ crystal. The black spots are inclusions of Te, and both samples are sufficient for detector applications and show fewer inclusions than are found in CZT crystals. The bottom of FIG. 4 shows two graphs which represent reconstructed 3D distributions of Te inclusions along the thickness of a $Cd_{1-x}Mg_xTe$ wafer at five different points over the 18-mm diameter wafer. The dimension of each 3D image is $1.1 \times 1.5 \times 3$ mm$^3$. It shows that there are very few inclusions above 20 microns before annealing and none after annealing. The annealed crystal has fewer inclusions and therefore fewer locations where electrons and holes can recombine prematurely. Annealing may be done in the presence of an excess of Cd and/or Mg.
Figure 6B:
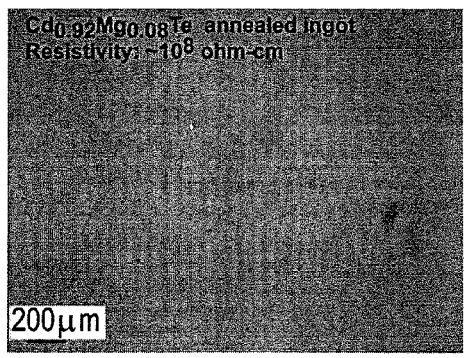
Figure 6C:
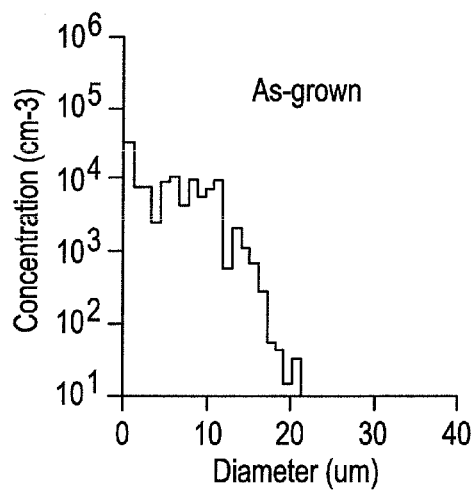
Figure 6D:
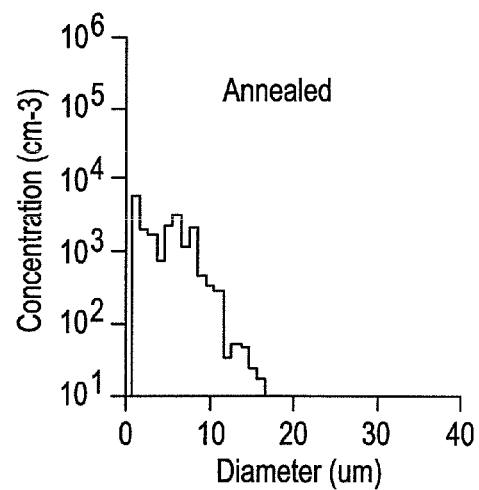
Figure 7:
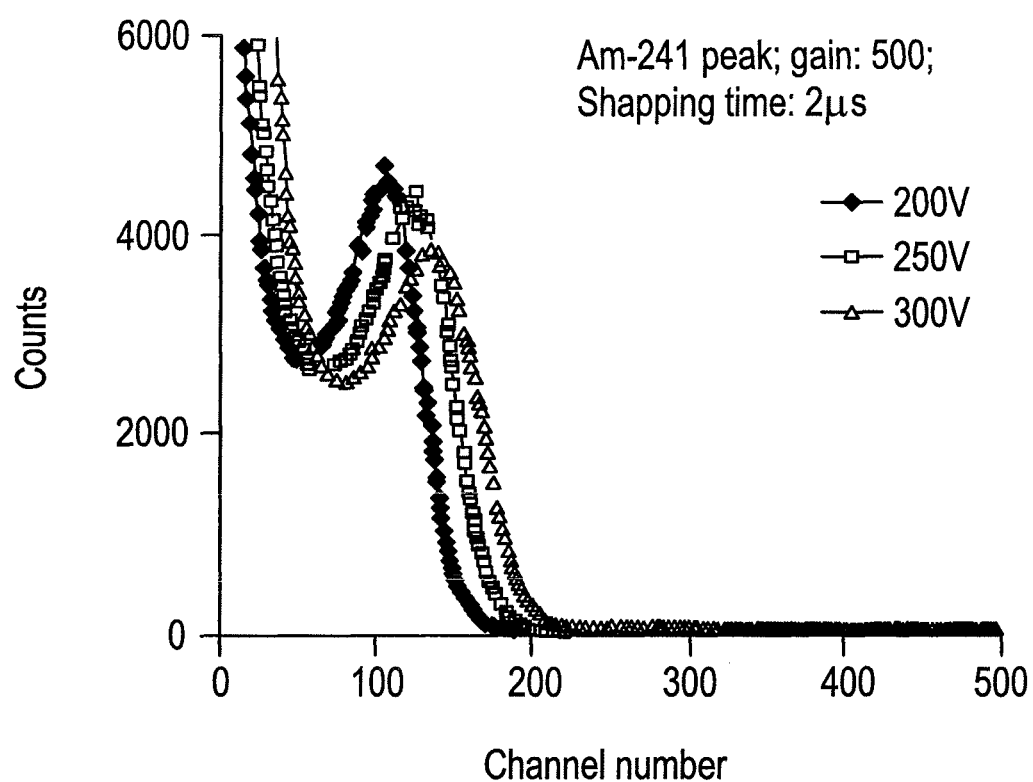
FIG. 7 shows the spectral response from $^{241}$Am source of a 2 μs pulse of a $8 \times 7 \times 3$ mm$^3$ planar in doped $Cd_{1-x}Mg_xTe$ detector. The spectra show the counts at channel numbers in the presence of three voltages 200 volts (blue), 250 volts (red) and 300 volts (green) as detected and plotted by a multichannel analyzer.

Crystals were grown by the zone melting with solvent method. An In-doped ingot $Cd_{0.92}Mg_{0.08}Te$ 18 mm diameter 34 mm length was grown with excess Te. The growth was carried out as described above. The ingot was mostly single crystal with very good crystalline perfection. From the single crystal thus grown samples were manufactured which had high resistivity $2 \times 10^{10}$ ohm·cm (FIG. 8). Samples were fabricated into 8×7×3 mm planar detector configured and as shown in FIG. 7 a good spectral response was achieved at 3 voltages (200 v, 250 v, and 300 v) from $^{241}$Am, a commonly used gamma ray source for energy calibration (Glemen F. Knoll, Radiation Detection and Measurement, John Wiley &Sons 2000, p. 486 488) and the electron mobility-lifetime value was determined to be $7 \times 10^{-4} V/cm^2$ (FIG. 9).

EXAMPLE 2

Crystals were grown by the zone melting with solvent method. An In-doped ingot $Cd_{0.95}Mg_{0.05}Te$ 20 mm diameter 42 mm length was grown with excess Te. The growth was carried out as described above. The ingot was mostly single crystal with very good crystalline perfection. From the single crystal thus grown samples were manufactured which had high resistivity $3 \times 10^{10}$ ohm·cm. Samples were fabricated in 8×7×3 mm planar configured in the same manner as Example 1 above. It was confirmed that the detector had a good spectral response from a $^{241}$Am source, and the electron mobility-lifetime value was determined to be $8 \times 10^{-4}$ $V/cm^2$.

EXAMPLE 3

Crystals were grown by the zone melting with solvent method. An In-doped ingot $Cd_{0.71}Mg_{0.29}Te$ 18 mm diameter 34 mm length was grown with excess Te. The growth was carried out as described above. The ingot was mostly single crystal with very good crystalline perfection. The calculated band gap at this composition is 2.0 eV.

Crystals were grown by the zone melting with solvent method. An In-doped ingot $Cd_{0.70}Mg_{0.30}Te$ 18 mm diameter 34 mm length was grown with excess Te. The growth was carried out as described above. The ingot had a poor crystalline perfection. Similarly bad crystalline perfection was demonstrated with the composition $Cd_{0.69}Mg_{0.31}Te$. $Cd_{1-x}Mg_xTe$ solid solutions in with concentrations of Mg in excess of $Cd_{0.70}Mg_{0.30}Te$ exhibit some evidence of wurtzite structure coexisting with zinc blend. This structure creates flaws which our as grown examples demonstrate preclude single crystal growth of a perfect zinc blend structure at concentration 30 at. % and higher.

These 2 failed crystallinity experiments coupled with the knowledge that 29 at. % produces an energy bandgap of 2.0 eV which is well within in the optimal bandgap range (1.7 eV to 2.2 eV) for room temperature detection, together establish the outer boundaries of the compositional range of $Cd_{1-x}Mg_xTe$ solid solution crystals used in a detector at 30 at. %.

What is claimed is:

1. A detection system for X-ray or gamma ray radiation comprising a solid solution $Cd_{1-x}Mg_xTe$ crystal in a composition range $Cd_{0.99}Mg_{0.01}Te$ to $Cd_{0.71}Mg_{0.29}Te$, an amplification, measurement, identification or imaging means, and an electrical contact means for connecting the $Cd_{1-x}Mg_xTe$ crystal to the amplification, measurement, identification or imaging means.

2. The detection system of claim 1 wherein the crystal has been annealed.

3. The detection system of claim 1 further comprising an insulating layer between the electrical contact means and the crystal.

4. The detection system of claim 1 wherein the crystal is doped with a Group III element.

5. The detection system of claim 4 wherein the Group III element is Indium.

6. The detection system of claim 4 wherein the Group III element is present in an amount of $1 \times 10^{17}$ $cm^{-3}$ to $3 \times 10^{17}$ $cm^{-3}$.

7. The detection system of claim 1 wherein the amplification, measurement, identification or imaging means is a spectrum.

8. A method for detecting X- or gamma ray radiation comprising
    (a) providing a solid solution $Cd_{1-x}Mg_xTe$ crystal in the composition range of $Cd_{0.99}Mg_{0.01}Te$ to $Cd_{0.71}Mg_{0.29}Te$;
    (b) providing an electrical contact means for connecting the $Cd_{1-x}Mg_xTe$ crystal to an amplification, measurement, identification or imaging means; and
    (c) detecting the presence of the X- or gamma ray radiation.

9. The method according to claim 8 further comprising providing a Group III element dopant to the crystal.

10. The method according to claim 9 wherein the dopant is Indium.

11. The method according to claim 9 wherein the dopant is present in an amount of $1 \times 10^{17}$ $cm^{-3}$ to $3 \times 10^{17}$ $cm^{-3}$.

12. The method according to claim 8 wherein the amplification, measurement, identification or imaging means is a spectrum.

13. The method according to claim 8 performed at approximately room temperature.

14. The method according to claim 8 wherein the detecting is performed using a system comprising a bias voltage source to provide positive and negative voltage.

15. The method according to claim 8 wherein the detecting is performed using a system comprising one or more preamplifiers.

16. The method according to claim 8 wherein the detecting is performed using a system that is a coaxial, a cross-strip plate, a co-planar, a pixilated, or a pad configuration.

* * * * *